United States Patent [19]

Tomoike et al.

[11] Patent Number: 5,341,233

[45] Date of Patent: Aug. 23, 1994

[54] LIQUID CRYSTAL MODULE WITH TAB ASSEMBLIES CONNECTED THROUGH A FLEXIBLE CIRCUIT BOARD

[75] Inventors: Kazuhiro Tomoike; Moriyoshi Kurosawa, both of Sodegaura, Japan

[73] Assignee: Idemitsu Kosan Co., Ltd., Tokyo, Japan

[21] Appl. No.: 972,478

[22] PCT Filed: May 14, 1992

[86] PCT No.: PCT/JP92/00621

§ 371 Date: Jan. 13, 1993

§ 102(e) Date: Jan. 13, 1993

[87] PCT Pub. No.: WO92/21051

PCT Pub. Date: Nov. 26, 1992

[30] Foreign Application Priority Data

May 15, 1991 [JP] Japan .................. 3-139731
Aug. 30, 1991 [JP] Japan .................. 3-244140

[51] Int. Cl.$^5$ .......................................... G02F 1/1343
[52] U.S. Cl. ................................ 359/88; 361/776; 359/83
[58] Field of Search .................. 359/84, 87, 88, 83, 359/70; 361/767, 749, 776, 398, 403, 418, 412

[56] References Cited

U.S. PATENT DOCUMENTS

| | | | |
|---|---|---|---|
| 4,514,042 | 4/1985 | Nujii et al. | 359/83 |
| 4,697,885 | 10/1987 | Minowa et al. | 359/88 |
| 4,904,065 | 2/1990 | Yuasa et al. | 359/100 |
| 5,029,984 | 6/1991 | Adachi et al. | 359/88 |
| 5,044,734 | 9/1991 | Sperl et al. | 359/70 |

FOREIGN PATENT DOCUMENTS

| | | |
|---|---|---|
| 0441398 | 8/1991 | European Pat. Off. . |
| 59-210419 | 11/1984 | Japan . |
| 61-267081 | 11/1986 | Japan . |
| 63-264730 | 11/1988 | Japan . |
| 2127621 | 5/1990 | Japan . |
| 2160218 | 6/1990 | Japan . |
| 2-85473 | 7/1990 | Japan . |
| 2248926 | 10/1990 | Japan . |

OTHER PUBLICATIONS

Patent Abstracts of Japan: vol. 13, No. 215 (p-874) May 19, 1989 & JP-A-01 132 231 (Seiko) Feb. 2, 1989*abstract*.

Patent Abstracts of Japan: vol. 14, No. 264 (p-1057) Jun. 7, 1990 & JP-A-02 073 219 (Idemitsu Kosan) Mar. 13, 1990 *abstract*.

Patent Abstracts of Japan: vol. 7, No. 60 (p-182) Mar. 12, 1983 & JP-A-57 205 711 (Richo) Dec. 16, 1982 *abstract*.

*Primary Examiner*—William L. Sikes
*Assistant Examiner*—Kenneth Parker
*Attorney, Agent, or Firm*—Kanesaka & Takeuchi

[57] ABSTRACT

A matrix liquid crystal unit having a liquid crystal panel composed of two flexible plastic substrates and a liquid crystal material sandwiched between the flexible plastic substrates, and a flexible circuit sheet with a plurality of liquid crystal driver TAB·LSI assemblies mounted thereon are electrically connected to each other, making up a liquid crystal unit. Each of the flexible plastic substrates has a group of liquid crystal driver electrodes. Each of the liquid crystal driver TAB·LSI assemblies has a group of output terminals connected respectively to the liquid crystal driver electrodes through connection lines on the flexible circuit sheet. A connector connected to electrode terminals on the flexible circuit sheet, an interface connector to be connected to electrode terminals of an external control device, and printed wires for electrically connecting the connectors to each other, jointly make up a thin board. A liquid crystal module is composed of the liquid crystal unit and the thin board which are superimposed one on the other.

10 Claims, 14 Drawing Sheets

FIG. 1
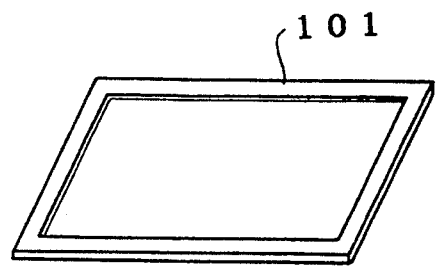
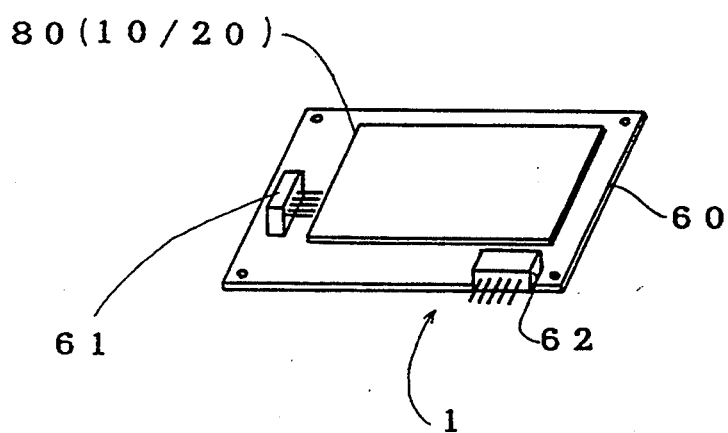
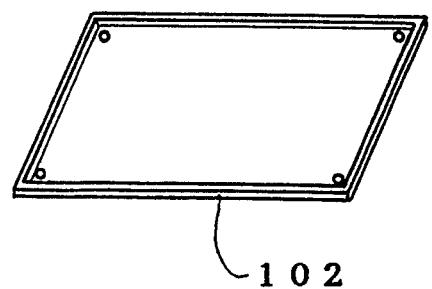

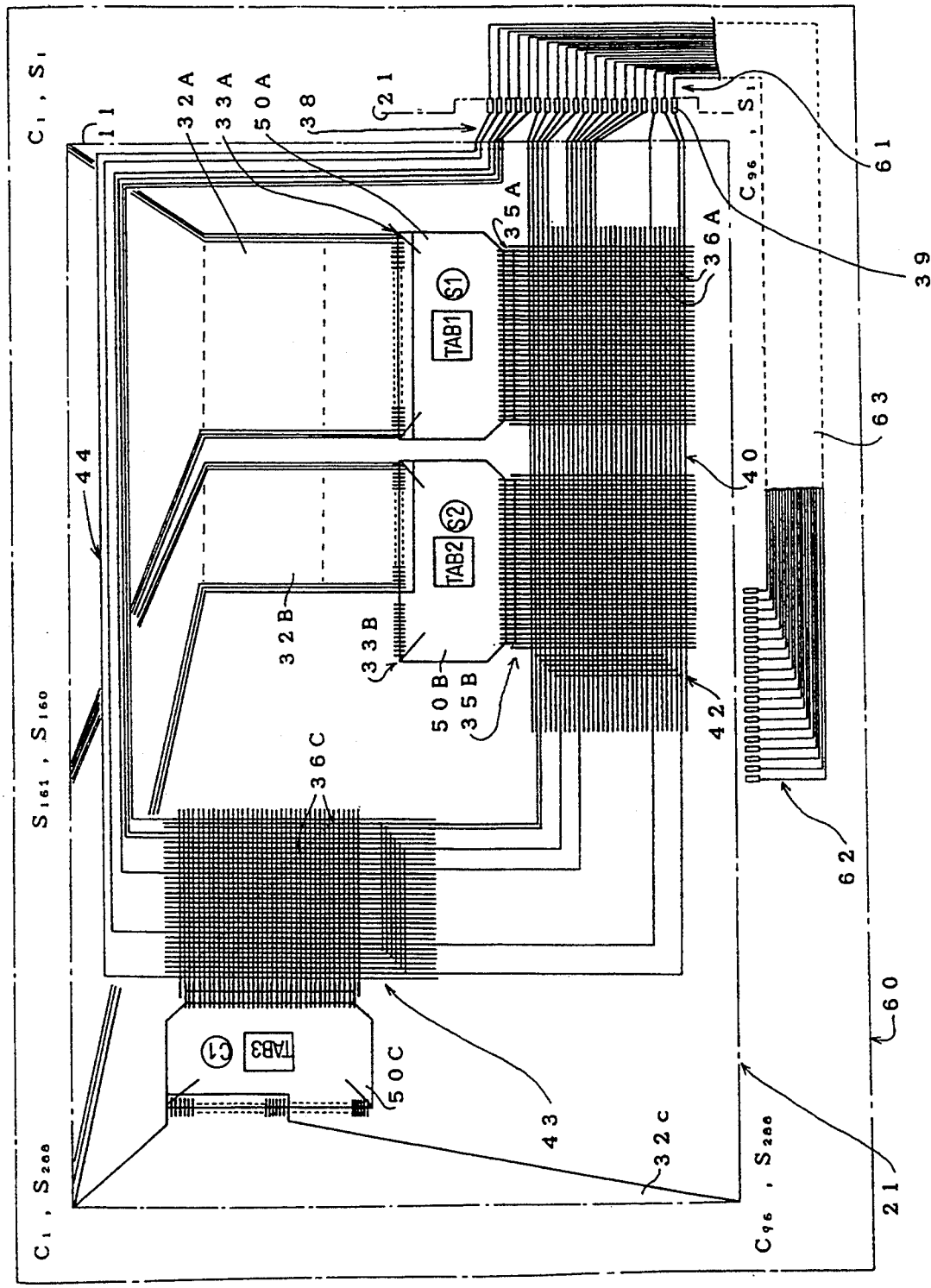

LIQUID CRYSTAL MODULE WITH TAB ASSEMBLIES CONNECTED THROUGH A FLEXIBLE CIRCUIT BOARD

DESCRIPTION

1. Technical Field

The present invention relates to an ultrathin and ultralightweight liquid crystal module which can freely be bent without causing troubles such as wiring breaks, and which has a liquid crystal panel and a board that can be replaced easily.

2. Background Art

As shown in FIG. 16 of the accompanying drawings, one conventional liquid crystal panel comprises a liquid crystal 201 sandwiched between a pair of glass substrates 200. The liquid crystal panel also has a group of liquid crystal drive electrodes (not shown) disposed on each of the glass substrates 200. These liquid crystal drive electrodes are connected to liquid crystal driver LSI circuits 203 through a connection circuit network on a printed circuit board 202.

Since the conventional liquid crystal panel is composed of glass substrates and a relatively hard printed circuit board, the entire assembly has been inflexible, rigid, and flat.

Large-size liquid crystal panels which incorporate glass substrates are considerably heavy. Therefore, it is necessary to install such large-size liquid crystal panels stably so that they will not be deformed and will be resistant to vibrations. A lot of labor is required to assemble and maintain the large-size liquid crystal panels, resulting in a great total cost which has made the large-size liquid crystal panels impracticable and prevented them from finding wide use.

In recent years, there have been developed various liquid crystal panels which have flexible plastic substrates and hence are lightweight and can be flexed, providing curved surfaces (see Japanese patent publication No. 1-6084 and Japanese laid-open patent publication No. 1-91113).

In such a liquid crystal panel with flexible plastic substrate, however, it is not possible to mount a printed-circuit board directly on a plastic substrate. It is therefore necessary to use a liquid crystal driver LSI circuit and an interconnection network as external circuits, around or independently separately from the liquid crystal panel. As a result, the liquid crystal display device incorporating the liquid crystal panel has large outer dimensions.

There is also known a liquid crystal display device including a liquid crystal panel that has flexible plastic substrates, and circuits such as a liquid crystal driver LSI circuit mounted on the reverse side of the liquid crystal panel through a reinforcing plate and a circuit board that can be bent to a certain extent.

With the known liquid crystal display device, configurations that the liquid crystal panel can take are governed by the rigidity and shape of the reinforcing plate and the circuit board which are disposed on the reverse side of the liquid crystal panel. Thus, the flexibility of the plastic substrates cannot fully be utilized, so that the liquid crystal display device displays desired information in a limited curvature range.

Another problem is that the weight and thickness of the liquid crystal panel are increased by the reinforcing plate and other components.

Since the circuit board and the liquid crystal driver LSI circuit are fixed to the liquid crystal panel, when the liquid crystal panel is deformed, stresses are developed in joints between terminals of liquid crystal driver electrodes on the plastic substrates and interconnections of the liquid crystal driver LSI circuit, tending to cause defects such as wiring breaks and peeling of the liquid crystal panel. In order to avoid such defects, the shape of the liquid crystal panel cannot be changed after it has been determined once.

The circuit board terminals and external input terminals are generally joined by soldering or the like. Therefore, when a defect occurs after the liquid crystal panel has been packaged, it is difficult to replace and reuse the liquid crystal panel and the circuit board, resulting in a reduced yield.

Prior liquid crystal display devices are designed such that a liquid crystal display unit is relatively large in size and an electronic circuit for driving the liquid crystal is as compact as possible for making the liquid crystal devices thin and light. To fabricate thin and light liquid crystal display devices, there is employed a TAB·LSI arrangement in which leads are formed on a tape-like film and a liquid crystal driver LSI is mounted on the film by TAB (Tape Automated Bonding).

Different methods of mounting a TAB·LSI arrangement or assembly on a liquid crystal panel are known in the art. According to one mounting method, the output terminals of the TAB·LSI assembly are directly connected to the output terminals of liquid crystal driver electrodes formed on glass substrates of a liquid crystal panel. Another mounting process employs a flexible printed circuit board (FPC) through which the output terminals of the TAB·LSI assembly are connected to the output terminals of liquid crystal driver electrodes. The terminals are connected by thermocompression bonding with an anisotropic conductive adhesive.

In liquid crystal display devices with TAB·LSI assemblies, the glass substrates and the base film or FPC board have different coefficients of thermal expansion because they are made of different materials. Therefore, when the terminals are cooled after they have been connected by thermocompression bonding, the joints between the glass substrates and the base film or FPC are subject to residual stresses arising from different degrees of shrinkage of the glass substrates and the base film or FPC board.

More specifically, the coefficient of thermal expansion of the glass substrates is about $4.0 \times 10^{-6}$ (cm/cm/°C.), and the coefficient of thermal expansion of the base film or FPC is about $3 \sim 7 \times 10^{-5}$ (cm/cm/°C.). As these coefficients of thermal expansion differ greatly from each other, any residual stresses applied to the electric joints between the glass substrates and the base film or FPC are large, tending to cause wiring breaks or other defects.

The terminals of the liquid crystal driver electrodes and the output terminals of the TAB·LSI assembly are closely spaced at small pitches and have small contact areas. Therefore, these terminals are liable to get peeled off easily, resulting in wiring breaks.

In order to solve the problem of the peeling of the terminals due to the different coefficients of thermal expansion, it has been known in the art to use a fastener to secure the terminals as disclosed in Japanese laid-open patent publication No. 2-214823, or to form the electrode terminals of the TAB·LSI assembly as projecting from the base film as disclosed in Japanese laid-open utility model publication No. 63-70149.

The proposal disclosed in Japanese laid-open patent publication No. 2-214823 has a problem in that the liquid crystal panel becomes thicker and heavier because of the fastener. The disclosure of Japanese laid-open utility model publication No. 63-70149 is disadvantageous in that the projecting electrode terminals are apt to be damaged or broken. Therefore, either one of the disclosed arrangements has proven unsatisfactory.

Therefore, it is an object of the present invention to provide a liquid crystal module which is free of the shortcomings of the conventional liquid crystal display devices, i.e., which is flexible, ultrathin and ultralightweight, and allows a liquid crystal panel and a circuit board (sheet) to be replaced easily.

Another object of the present invention is to provide a liquid crystal module which allows a liquid crystal panel to be bent freely without causing troubles such as wiring breaks or the like.

DISCLOSURE OF THE INVENTION

A liquid crystal module according to the present invention comprises a matrix liquid crystal unit having a liquid crystal panel composed of two flexible plastic substrates and a liquid crystal material sandwiched between the flexible plastic substrates, and a flexible circuit sheet (FPC) with a plurality of liquid crystal driver TAB·LSI assemblies mounted thereon, and a thin board composed of a connector connected to electrode terminals on said flexible circuit sheet, an interface connector to be connected to electrode terminals of an external control device, and printed wires for electrically connecting the connectors to each other, the matrix liquid crystal and the thin board being of an integral construction. Preferably, all of the liquid crystal driver TAB·LSI assemblies are mounted as a whole on a flat surface of the flexible circuit sheet.

The liquid crystal module thus constructed is flexible, ultralightweight, and ultrathin, allowing the liquid crystal panel and the circuit sheet to be replaced easily.

A liquid crystal module further according to the present invention comprises at least a liquid crystal panel having two flexible plastic substrates and a liquid crystal material sandwiched between the flexible plastic substrates, and a plurality of liquid crystal driver TAB·LSI assemblies, each of said flexible plastic substrates having a group of liquid crystal driver electrodes mounted thereon, each of said liquid crystal driver TAB·LSI assemblies having a group of output terminals connected respectively to said liquid crystal driver electrodes.

Also according to the present invention, a liquid crystal module comprises at least a liquid crystal panel having two flexible plastic substrates and a liquid crystal material sandwiched between the flexible plastic substrates, a plurality of liquid crystal driver TAB·LSI assemblies, and a flexible circuit sheet having connection lines formed thereon, each of said flexible plastic substrates having a group of liquid crystal driver electrodes mounted thereon, each of said liquid crystal driver TAB·LSI assemblies having a group of output terminals connected respectively to said liquid crystal driver electrodes through said connection lines on said flexible circuit sheet.

The liquid crystal panel of the liquid crystal module can freely be bent without causing troubles such as wiring breaks or the like.

BRIEF DESCRIPTION OF THE DRAWINGS

FIG. 1 is an exploded perspective view of a liquid crystal display including a liquid crystal module according to a first embodiment of the present invention;

FIG. 8 is a view showing an entire wiring system of the liquid crystal module according to the first embodiment of the present invention;

BEST MODE FOR CARRYING OUT THE INVENTION

The present invention will be described in detail with reference to the accompanying drawings.

A first embodiment of the present invention will first be described with reference to FIGS. 1 through 8.

Figure 2:
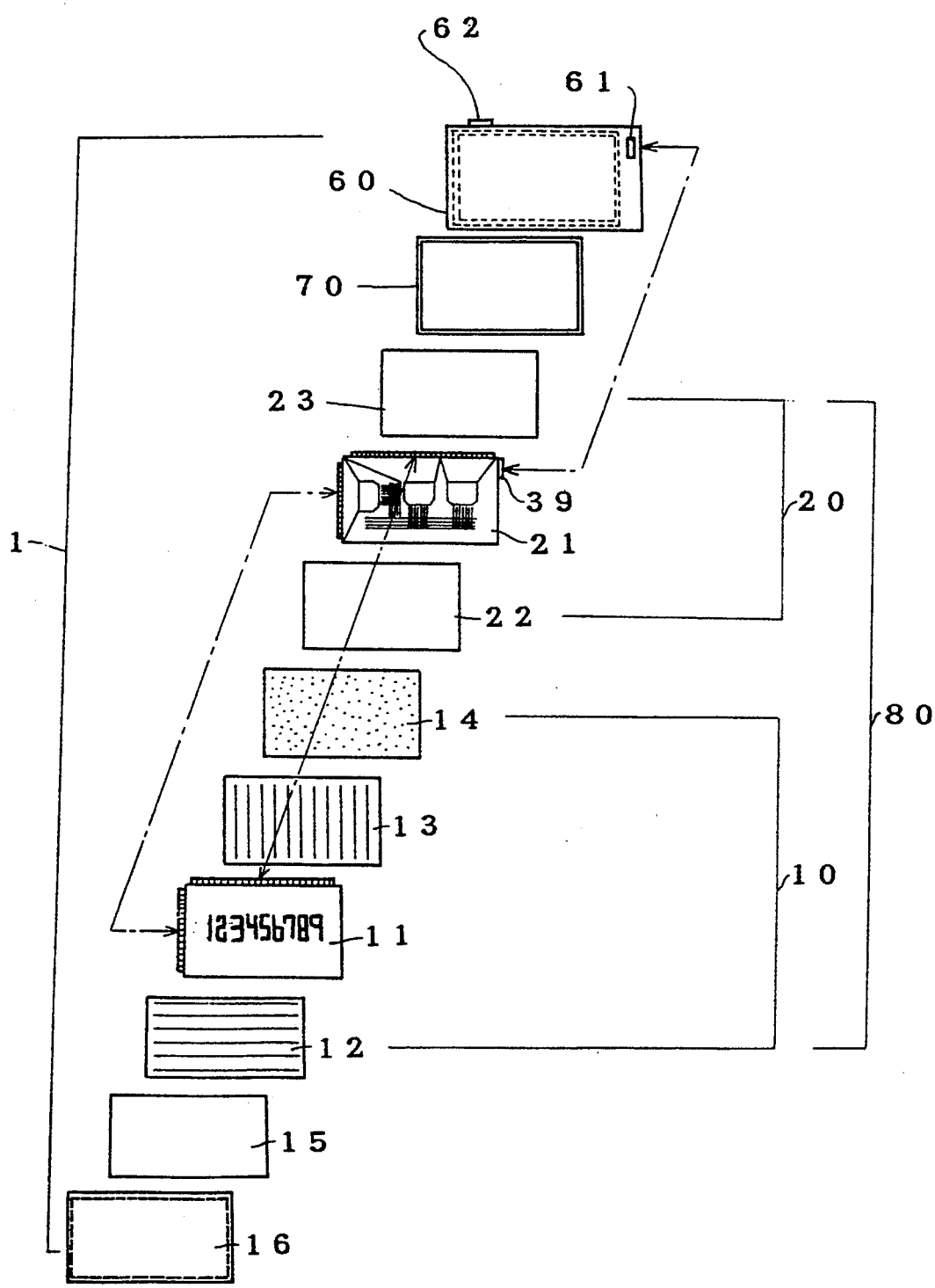
FIG. 2 is an exploded perspective view of the liquid crystal module according to the first embodiment of the present invention.

FIG. 1 is an exploded perspective view of a liquid crystal display including a liquid crystal module according to the first embodiment of the present invention, and FIG. 2 is an exploded perspective view of the liquid crystal module according to the first embodiment of the present invention.

As shown in FIG. 1, a liquid crystal module 1 according to the first embodiment is housed in an outer casing comprising a front panel 101 and a rear panel 102, and the entire assembly is used as a liquid crystal display.

The liquid crystal module 1 comprises a liquid crystal unit 80 which has a liquid crystal panel unit 10 having at least a liquid crystal panel and a circuit unit 20 having at least a flexible circuit sheet (FPC), the liquid crystal panel unit 10 and the circuit unit 20 being connected to each other, and a thin board 60.

As shown in FIG. 2, the liquid crystal panel unit 10 comprises a liquid crystal panel 11 composed of a liquid crystal sandwiched between two thin flexible plastic substrates, a polarizing filter 12 disposed on the face side (front surface) of the liquid crystal panel 11, a polarizing filter 13 and a reflector 14 which are disposed on the reverse side of the liquid crystal panel 11. The liquid crystal panel 11, the polarizing filters 12, 13, and the reflector 14 are superimposed without clearances therebetween.

Although not shown in FIG. 2, each of the flexible plastic substrates of the liquid crystal panel 11 has a group of liquid crystal driver electrodes on its surface sandwiching the liquid crystal. The liquid crystal driver electrodes include segment electrodes on one of the flexible plastic substrates and common electrodes on the other flexible plastic substrate. The liquid crystal panel 11 is therefore of the matrix display type.

The flexible plastic substrates may be made of a crystalline polymer such as uniaxially or biaxially oriented polyethylene terephthalate, a non-crystalline polymer such as polysulfone, polyether sulfone, or polycarbonate, a polyolefin such as polyethylene or polypropylene, a polyamide such as nylon. Of these materials, particularly preferable are uniaxially or biaxially oriented polyethylene terephthalate and polyether sulfone.

The two flexible plastic substrates may be of the same material or different materials. Normally, at least one of the flexible plastic substrates is optically transparent, with transparent electrodes mounted thereon.

The flexible plastic substrates should have a thickness of 0.3 mm or less each. If the thickness of the flexible plastic substrates exceeds 0.3 mm, they only allow the liquid crystal panel 11 to be deformed to large curvatures. As the thickness of the flexible plastic substrates is reduced, the flexible plastic substrates can be deformed freely to small and large curvatures. Preferably, the thickness of the flexible plastic substrates should range from 20 to 100 μm. The flexible plastic substrates in such a thickness range may be referred to as flexible films.

The liquid crystal driver electrodes on the flexible plastic substrates may be made of any materials insofar as they are electrically conductive. However, the electrodes in at least one of the groups should preferably be made of a material that is both electrically conductive and transparent. Specifically, those electrodes may comprise transparent electrodes made of indium oxide or ITO (Indium Tin Oxide) which is a mixture of indium oxide and tin oxide.

The liquid crystal driver electrodes may be formed on the flexible plastic substrates by any known process such as evaporation, sputtering, or the like.

The liquid crystal sandwiched between the flexible plastic substrates is not limited to any materials, but should preferably be made of a ferroelectric liquid crystal material, for example, a ferroelectric liquid crystalline polymer or a composition thereof.

The ferroelectric liquid crystal may be a ferroelectric low-molecular weight liquid crystal (monomeric liquid crystal), a ferroelectric liquid crystalline polymer, or their mixture.

The ferroelectric low-molecular weight liquid crystal may, for example, be one or more ferroelectric low-molecular weight liquid crystals, or a ferroelectric low-molecular weight liquid crystal which comprises a mixture of one or more ferroelectric low-molecular weight liquid crystals and another low-molecular weight liquid crystal.

The ferroelectric liquid crystalline polymer polymers, or a ferroelectric liquid crystalline polymer which comprises one or more ferroelectric low-molecular weight liquid crystals and one or more ferroelectric liquid crystalline polymers, or a ferroelectric liquid crystalline polymer which comprises one or more ferroelectric low-molecular weight liquid crystals and one or more other liquid crystalline polymers.

More specifically, the ferroelectric liquid crystalline polymer may be any of all liquid crystalline polymers which exhibit the ferroelectric property, e.g., a ferroelectric liquid crystalline polymer (a homopolymer, or a copolymer, or a mixture thereof) whose polymer molecules exhibit ferroelectric liquid crystal characteristics, or a mixture of a ferroelectric liquid crystalline polymer and another liquid crystalline polymer and/or an ordinary polymer, or a mixture of a ferroelectric liquid crystalline polymer and a ferroelectric low-molecular weight liquid crystal, a mixture of a ferroelectric liquid crystalline polymer, a ferroelectric low-molecular weight liquid crystal, a liquid crystalline polymer and/or an ordinary polymer, or a mixture of any of the above liquid crystal or mixtures and an ordinary low-molecular weight liquid crystal.

Particularly referable of the above ferroelectric liquid crystalline polymers is a side-chain ferroelectric liquid crystalline polymer in chiral smectic C phase, for example.

Examples of the ferroelectric liquid crystalline polymeric compounds are decyloxy-benzylidene-P'-amino-2-methylbutyl-cinnamate (DOBAMBC), hexyloxy-benzylidene-P'-amino-2-chloropropyl-cinnamate (HOBACPC), and 4-o-(2-methyl)-butylresorcylidene-4'-octylaniline (MBRA8).

When the liquid crystal panel is constructed of the above materials, it is kept at such a temperature that the liquid crystal compound will be in SmC* phase or SmH* phase. If necessary, the liquid crystal panel may be supported on a copper block or the like in which a heater is embedded.

According to the present invention, it is also possible to use a ferroelectric liquid crystal in chiral smectic F phase, I phase, J phase, G phase, or K phase, other than SmC* phase or SmH* phase.

The ferroelectric liquid crystal composition may contain an adhesive, a viscosity reducer, a non-liquid-crystal chiral compound, a dye, etc. The thickness of the liquid crystal layer should preferably, but not necessarily, be in the range of from 2 to 4 μm.

From the viewpoint of providing a liquid crystal panel having a large display area, flexibility, a lightweight, and a thin profile, it is preferable to use a ferroelectric liquid crystalline polymer among other ferroelectric liquid crystal materials.

The polarizing filters 12, 13 are generally made of a polyvinyl alcohol (PVA)—iodine material, or a PVA—material. The polarizing filters 12, 13 should preferably be flexible, and hence should preferably of a thickness of 0.2 mm or less.

The polarizing filters 12, 13 are disposed on the face and reverse sides, respectively, of the liquid crystal panel 11 in crossed nicols. If a guest-host liquid crystal is used, then the polarizing filters are disposed on the face side (display side) of the liquid crystal, or the opposite side (reverse side) thereof. In any case, the polarizing filters 12, 13 are bonded to the flexible plastic substrates such that the contrast ratio achieved when the electric field is turned on and off is maximum.

The reflector 14 is positioned on the reverse side (non-display side) of the liquid crystal panel. The reflector 14 may be a metal foil of aluminum (Al), a sheet composed of a metal foil and a resin film bonded thereto, or the like. The reflector 14 should preferably be of a thickness of 0.2 mm or less.

If a backlight is employed in place of the reflector, then the liquid crystal panel is of the transmission type.

A color film (color filter) 15 and a protective plate 16 are positioned in front of the liquid crystal panel 10. The color-film 15 is used to adjust the color tone, and the protective plate 16 is used to give the liquid crystal panel 10 a safety strength required in the use.

Figure 3:
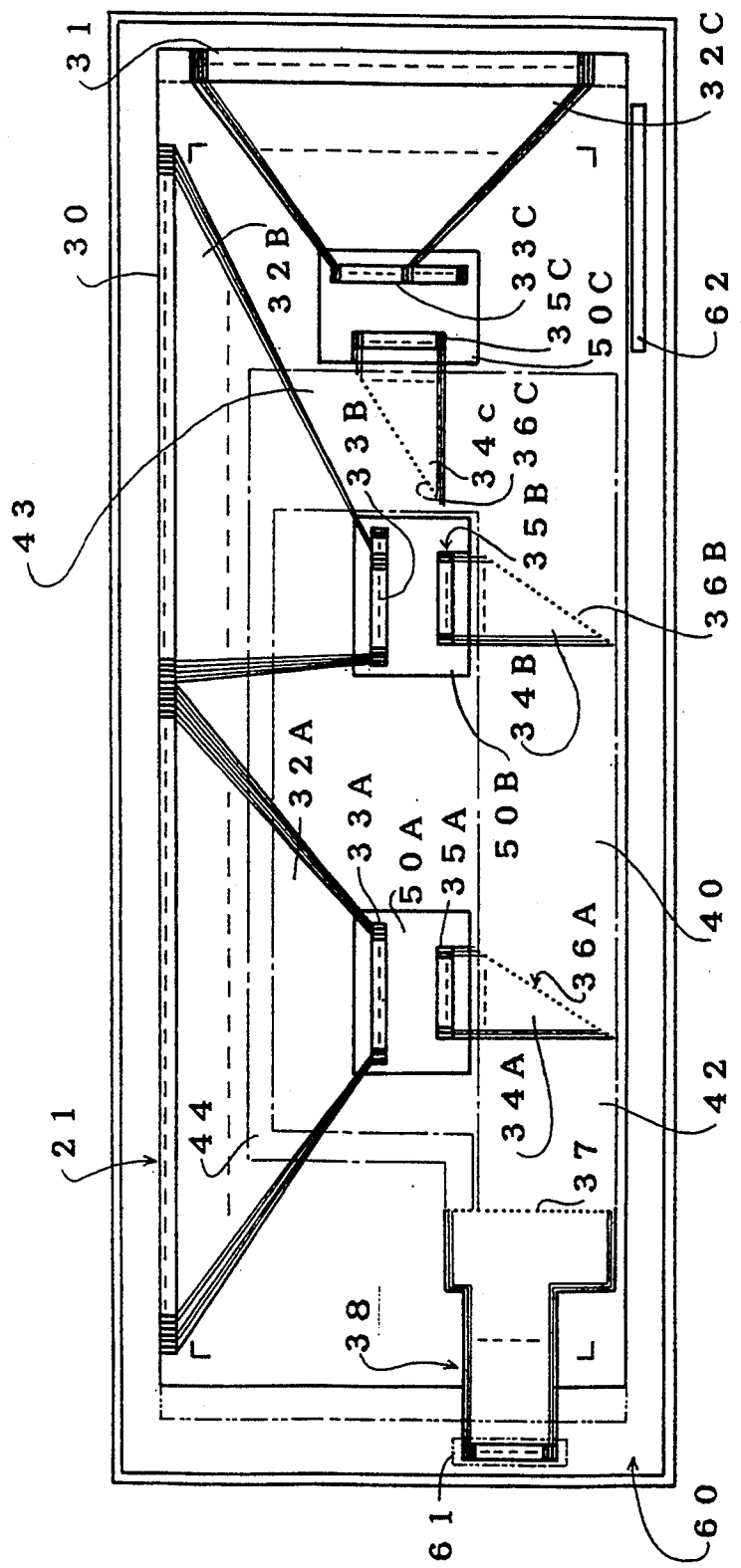
FIG. 3 is a plan view of a liquid crystal driver TAB-mounted flexible circuit sheet for the liquid crystal module according to the first embodiment of the present invention.

As shown in FIG. 3, the circuit unit 20 comprises a flexible circuit sheet (FPC) 21 with a plurality of liquid crystal driver TAB·LSI assemblies (described later on) 50A, 50B, and insulation sheets 22, 23 superimposed on the respective opposite surfaces of the flexible circuit sheet 21.

The flexible circuit sheet 21 comprises, as shown in FIG. 3, a polyester film having a thickness of 25 with printed wires on its face and reverse sides, two TAB·LSI assemblies 50A, 50B for driving the common electrodes, and one TAB·LSI assembly 50C for driving the segment electrodes, the TAB·LSI assemblies 50A, 50B, 50C being mounted flatwise on the polyester film. The flexible circuit sheet 21 serves to drive the common and segment electrodes of the liquid crystal panel described above.

The printed wires on the face and reverse sides of the flexible circuit sheet 21 are connected via through holes. The face and reverse sides of the flexible circuit sheet 21 are electrically insulated from external components by the insulation sheets 22, 23 superimposed on the face and reverse sides of the flexible circuit sheet 21.

The flexible circuit sheet 21 should preferably be composed of a polyester film or polyimide film which is highly soft and heat-resistant. The thickness of the flexible circuit sheet 21 should preferably be of 0.1 mm or smaller.

The printed wires (as a conductive layer) may be made of any electrically conductive material. However, in order to prevent them from being broken even when a wiring sheet is folded over, the printed wires should preferably be made of electrically conductive particles of silver, graphite, metal, or their blend, dispersed in a flexible polymeric resin binder. The printed wires may be produced by screen printing, photolithography, or the like.

The flexible circuit sheet 21 should preferably be disposed on the back of the liquid crystal panel 11 in order to be able to increase the proportion of the display area with respect to the liquid crystal module.

Figure 4:
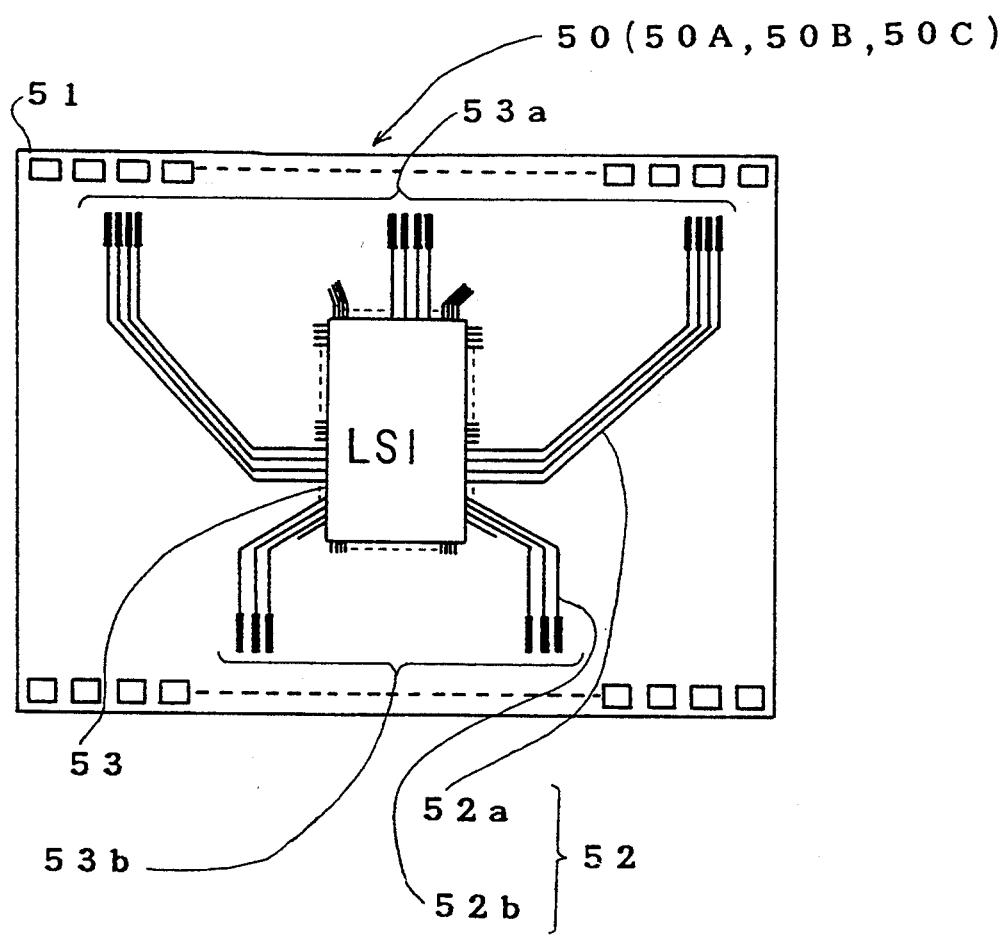
FIG. 4 is a plan view of a liquid crystal driver TAB circuit for the liquid crystal module according to the first embodiment of the present invention.

As shown in FIG. 4, each of the liquid crystal driver TAB·LSI assemblies 50A, 50B, 50C, collectively referred to as "TAB·LSI assembly 50" comprises a base film 51 in the shape of a tape with sprocket holes, leads 52a, 52b formed on the base film 51, and LSI circuits 53 mounted on the base film 51 and connected to the leads 52a, 52b by TAB (Tape Automated Bonding). Such an assembly is referred to as a TAB·LSI assembly. The TAB·LSI assembly 50 is distinct from an ordinary LSI circuit which is mounted on a lead frame by wire bonding.

The TAB·LSI assembly should preferably be of a thickness of 1 mm or less.

The base film 51 on which the LSI circuit is mounted comprises a polyimide or polyester (PET) film which is highly soft and heat-resistant. Output terminals 53a are connected to the respective distal ends of the leads 52a, and input terminals 53b are connected to the respective distal ends of the leads 52b.

There are 160 output terminals 53a and 34 input terminals 53b.

Figure 5:
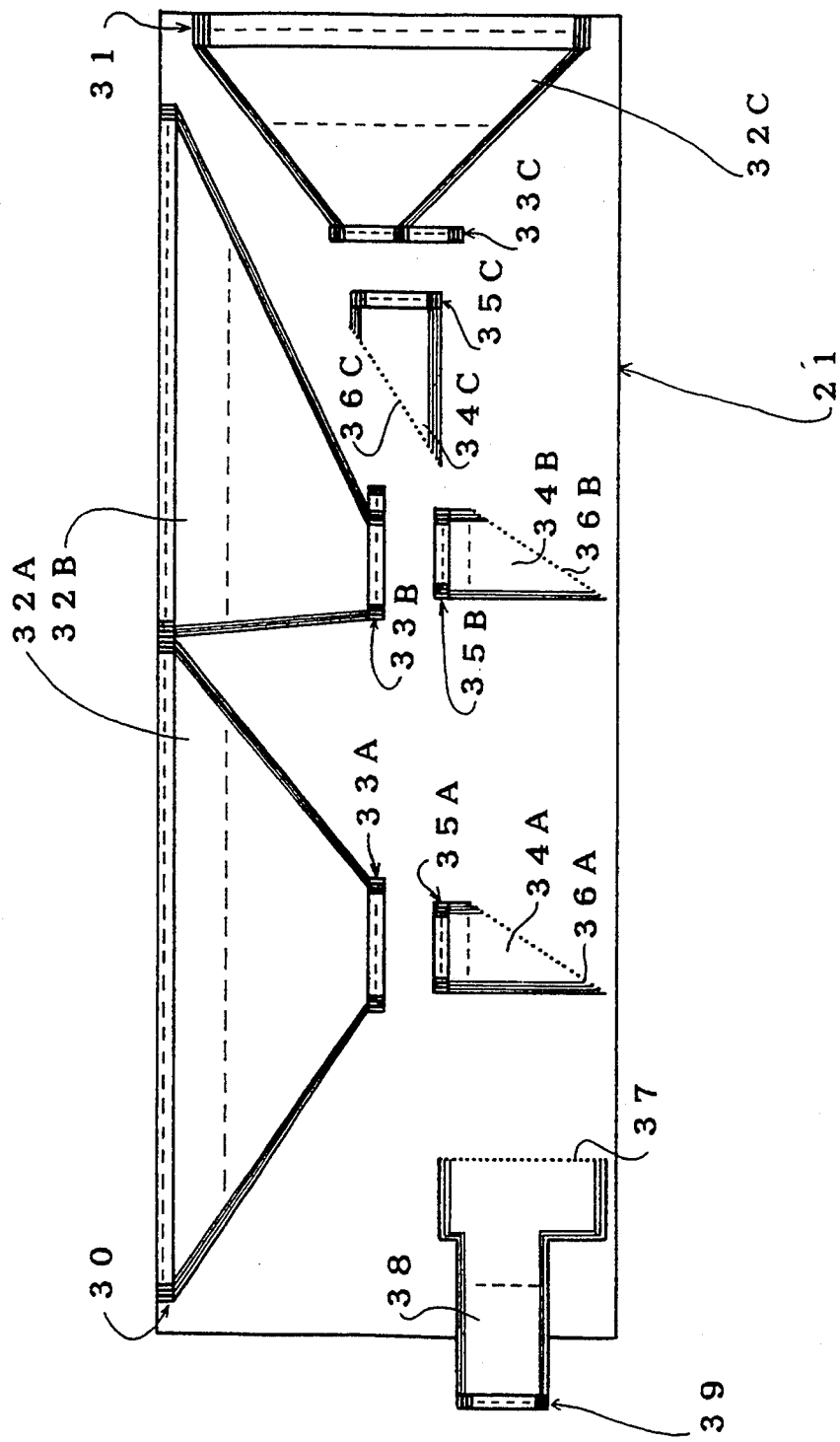
FIG. 5 is a plan view showing a wiring pattern on the face side of a circuit sheet of the liquid crystal module according to the first embodiment of the present invention.

The flexible circuit sheet 21 has printed wires on its face side as shown in FIG. 5. In FIG. 5, the flexible circuit sheet 21 supports on its upper end 288 segment-side electrode terminals 30 and on its righthand end 96 common-side electrode terminals 31. These segment-side electrode terminals 30 and common-side electrode terminals 31 jointly serve as liquid crystal driver electrodes.

Of the 288 segment-side electrodes 30, 160 electrodes positioned on the lefthand side are driven by the TAB·LSI assembly 50A (whose all 160 electrodes are employed) through printed wires 32A, and remaining 128 electrodes positioned on the righthand side are driven by the TAB·LSI assembly 50B (whose 128 out of 160 electrodes are employed) through printed wires 32B.

Likewise, the 96 common-side electrodes 31 are driven by the TAB·LSI assembly 50C (whose 96 out of 160 electrodes are employed) through printed wires 32C. The printed wires 32A~32C have ends arranged as heat-sealing connectors 33A~33C, respectively, which can be connected to the output terminals 53a of the TAB·LSI assemblies by thermal compression. Specifically, hot-melt resin layers are coated as adhesive layers on the printed wires for connection to the output terminals 53a of the TAB·LSI assemblies by thermal compression.

The face side of the flexible circuit sheet 21 also has printed wires 34A~34C to be connected to the input terminals 53b of the TAB·LSI assemblies 50A~50C as shown in FIG. 4. The printed wires 34A~34C have ends arranged as heat-sealing connectors 35A~35C, respectively, which can be connected to the input terminals 53b of the TAB·LSI assemblies by thermal compression.

The printed wires 34A~34C are connected to printed wires (described later on) on the reverse side of the flexible circuit sheet 21 via through holes 36A~36C. The printed wires on the reverse side are joined via through holes 37 to input/output buses 38 on the face side of the flexible circuit sheet 21, which are connected to 26 input-side electrode terminals 39 that are connected to a lock connector 61 of the thin board 60.

The input-side electrode terminals 39 are lined with a thin plastic reinforcing plate, providing a thickness of about 0.3 mm, as only the flexible sheet (which is 25 μm thick) has too small mechanical strength.

Figure 6:
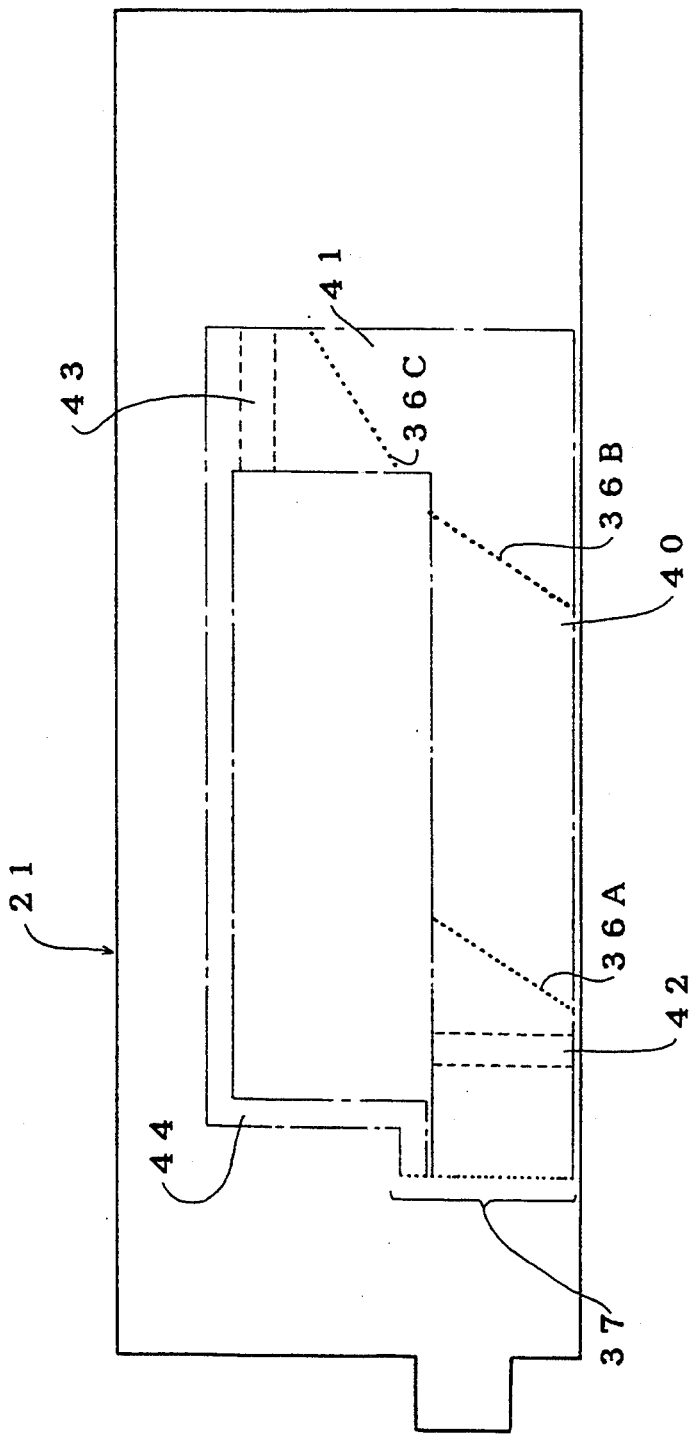
FIG. 6 is a plan view showing a wiring pattern on the reverse side of a circuit sheet of the liquid crystal module according to the first embodiment of the present invention.

FIG. 6 shows a circuit pattern on the reverse side of the flexible circuit sheet 21.

The input terminals of the TAB·LSI assemblies 50A, 50B on the face side of the flexible circuit sheet 21 are connected via the through holes 36A, 36B to 34 segment-side common buses 40. Similarly, the input terminals of the TAB·LSI assembly 50C on the face side of the flexible circuit sheet 21 are connected via the through holes 36C to 34 common-side common buses 41. The segment-side common buses 40 and the common-side common buses 41 are selectively coupled for carrying out a predetermined sequence control process.

The segment-side common buses 40 are gathered into 20 buses in a connection area 42, and the common-side common buses 41 are gathered into 6 control buses 44 in a connection area. The 6 control buses 44 are added to the 20 segment-side common buses 40, and a total of 26 buses are connected to the input/output buses on the face side via the through holes 37. The buses are gathered by short-circuiting and selecting common buses.

After the liquid crystal panel unit 10 and the circuit unit 20 are superimposed one on the other, the segment and common electrodes of the liquid crystal panel unit 10 and the segment- and common-side electrodes of the circuit unit 20 are heat-sealed so as to be electrically connected, thus making up the liquid crystal unit 80.

The liquid crystal panel unit 10 and the circuit unit 20 are mechanically mounted on each other lightly by a double-sided adhesive tape, a cellophane tape, an adhesive, or the like.

Figure 7:
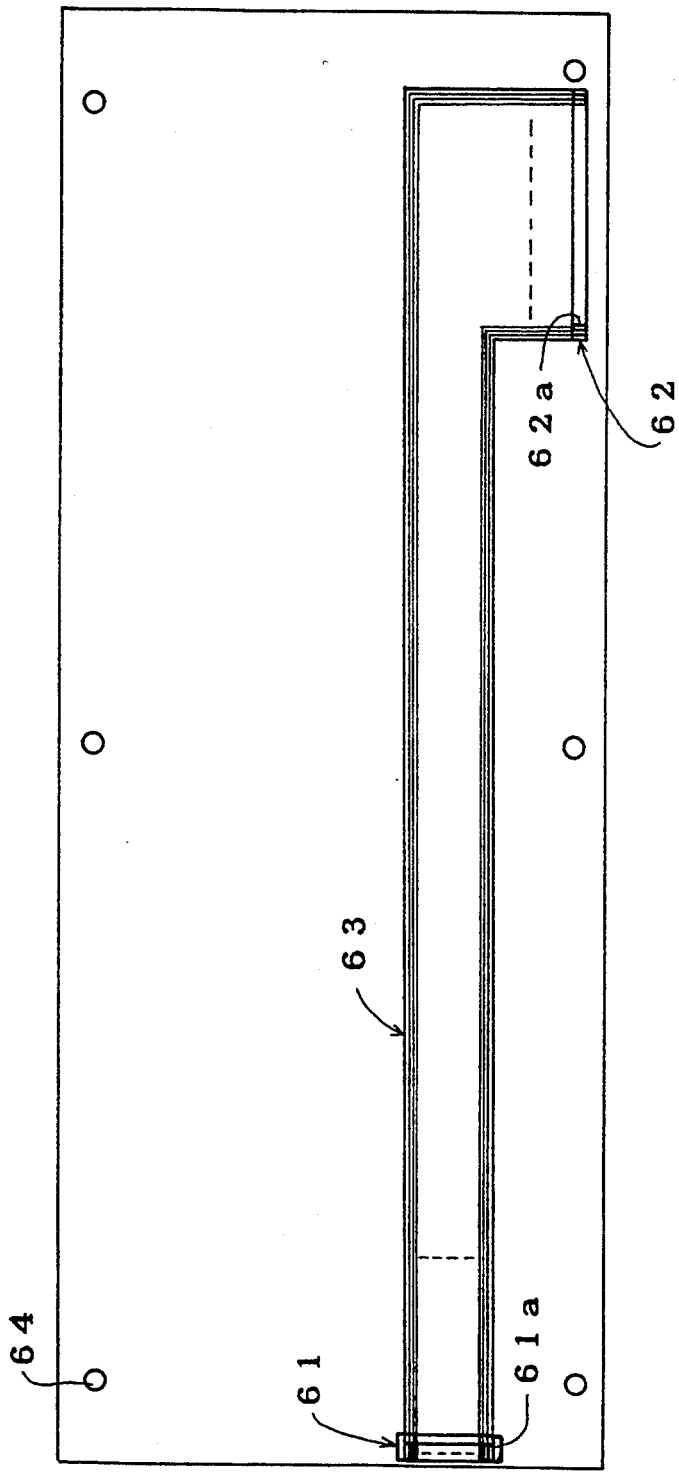
FIG. 7 is a plan view of a thin board of the liquid crystal module according to the first embodiment of the present invention.

As shown in FIG. 7, the thin board (printed board) 60 has a lock-connector 61 for connection to the electrode terminals 39 of the flexible circuit sheet 21 shown in FIG. 5, and an interface connector 62 for connection to electrode terminals of an external control device. The lock connector 61 and the interface connector 62 are connected to each other by 26 printed wires 63 having electrodes 61a, 62a on their opposite ends. The lock connector 61 is joined to the 26 electrodes 61a by soldering or the like, and the interface connector 62 is joined to the 26 electrodes 62a by soldering or the like.

The thin board 60 has attachment holes 64 defined therein at suitable positions. The thin board 60 has a thickness ranging from about 0.1 mm to 2~3 mm. The thin board 60 may be made of a synthetic resin such as epoxy, polyester, or the like, or a composite material of such a synthetic resin and glass fibers.

The thin board 60 is placed over the liquid crystal unit 80, thus providing the liquid crystal module 1. The thin board 60 serves as a reinforcing plate for the liquid crystal unit 80.

Between the thin board 60 and the liquid crystal unit 80, there is interposed a frame-shaped spacer 70 for averaging the thicknesses of the liquid crystal unit 80. The thin board 60 and the liquid crystal unit 80 are mounted on each other lightly by a double-sided adhesive tape, a cellophane tape, an adhesive, or the like.

The lock connector 61 on the thin board 60 is electrically connected to the terminals 39 on the flexible circuit sheet 21.

The lock connector 61 can freely be inserted into the terminals 39, and can be locked in place by a lever for reliable electric connection with the terminals 39. The lock connector 61 can freely be released from the terminals 39 by the lever without large forces. When a defect occurs after the liquid crystal panel has been mounted, the liquid crystal panel and the flexible circuit sheet can be replaced so that the other components than the liquid crystal unit can simply be reused, resulting in an increased yield.

FIG. 8 shown in plan an entire wiring system of the liquid crystal module. The segment electrodes are shown on the upper end, and the common electrodes on the righthand end.

When the liquid crystal panel 11 is viewed in front elevation, the lefthand upper end serves as the origin of a display coordinate system on the liquid crystal panel as a display. The common electrode $C_1$ on the first row and the segment electrode $S_1$ on the first column are positioned at the righthand upper end or corner as viewed from the reverse side. Similarly, the pairs of the common electrode $C_1$ and the segment electrode $S_{288}$, the common electrode $C_{96}$ and the segment electrode $S_1$, and the common electrode $C_{96}$ and the segment electrode $S_{288}$ are positioned at other ends or corners, with all the electrodes being given full-scale coordinates.

When a suitable control signal is applied from the external control device to the liquid crystal module through the interface connector 62, the control signal is applied through the printed wires 63 and the lock connector 61 on the thin board 60 to the TAB·LSI assemblies 50A~50C on the flexible circuit sheet 21. The TAB·LSI assemblies 50A~50C produce output signals to apply liquid crystal drive voltages to the segment electrodes $S_1 \sim S_{288}$, the common electrodes $C_1 \sim C_{96}$ of the liquid crystal panel 11.

Since the liquid crystal module according to the present invention is flexible, ultralightweight, and ultrathin, it can be used as a single layer, or a plurality of liquid crystal modules can be superimposed as layers for displaying images in multiple gradations. When the liquid crystal module is combined with color filters, it can display color images easily.

The numbers of segment and common electrodes of the liquid crystal panel in the liquid crystal module may be selected as desired, and the printed wires and the number of TAB·LSI assemblies on the flexible circuit sheet are designed depending on the selected numbers of segment and common electrodes.

The lock connector and the interface connector may be replaced with other connectors having equivalent functions.

A second embodiment of the present invention will be described below with reference to FIGS. 9 through 15.

Figure 9A:
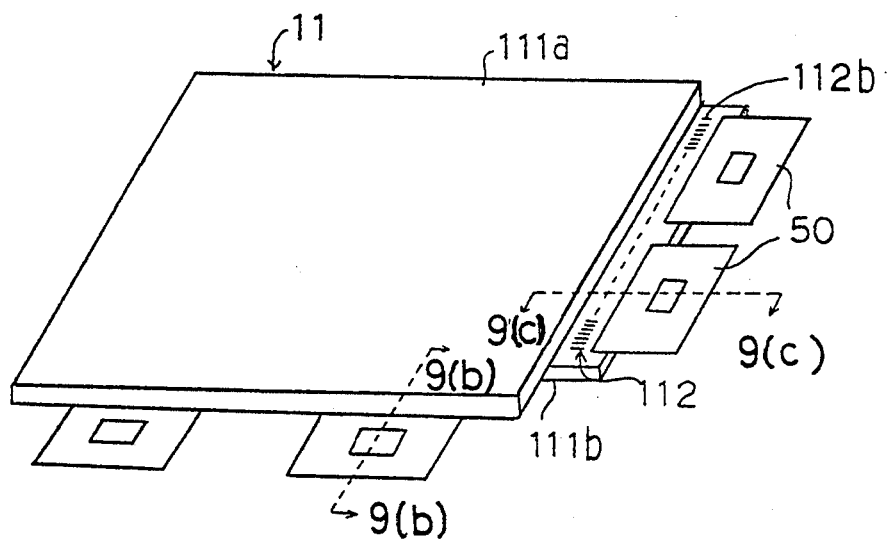
FIG. 9(a) is a perspective view of one specific arrangement of a liquid crystal module according to a second embodiment of the present invention.
Figure 9B:
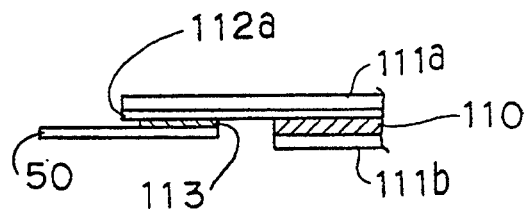
FIGS. 9(b) and 9(c) are cross-sectional views of the specific arrangement shown in FIG. 9(a)
Figure 9C:
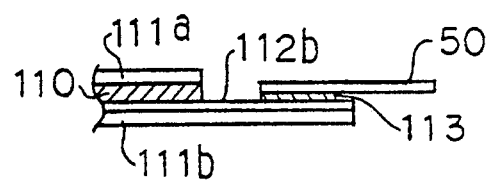

FIG. 9(a) shows in perspective view one specific arrangement of a liquid crystal module according to the second embodiment of the present invention, and FIGS. 9(b) and 9(c) are cross-sectional views taken along lines 9b—9b and 9c—9c, respectively, of FIG. 9(a), showing connection structures for segment and common electrode sides, respectively.

In FIGS. 9 (a), 9 (b), and 9 (c), the liquid crystal module comprises at least a liquid crystal panel 11, and TAB·LSI assemblies 50.

The liquid crystal panel 11 is composed of a liquid crystal material 110 sandwiched between two flexible plastic substrates 111a, 111b. Each of the flexible plastic substrates 111a, 111b has a group of liquid crystal driver electrodes 112 on its surface sandwiching the liquid crystal. The liquid crystal driver electrodes 112 include segment electrodes 112a on the flexible plastic substrate 111a and common electrodes 112b on the flexible plastic substrate 111b.

The materials of the flexible plastic substrates 111a, 111b and the liquid crystal 110 are the same as those of the first embodiment described above.

Figure 10:
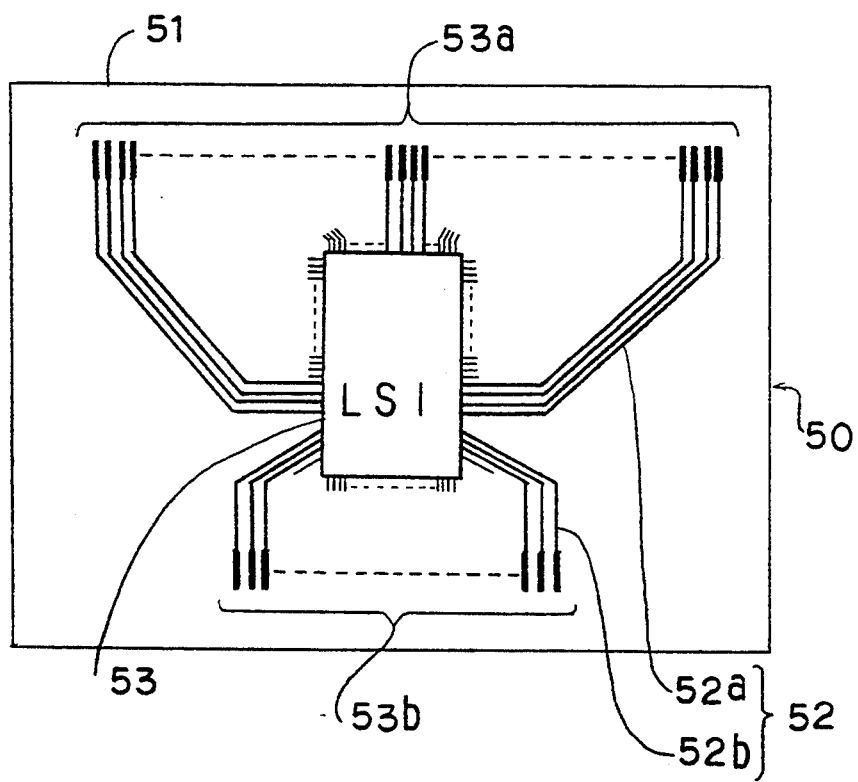
FIG. 10 is a plan view of a liquid crystal driver TAB·LSI assembly of the specific arrangement shown in FIG. 9(a)

As shown in FIG. 10, each of the liquid crystal driver TAB·LSI assemblies is similar to the liquid crystal driver TAB·LSI assembly according to the first embodiment as shown in FIG. 4, except that no sprocket holes are defined. In the second embodiment, output terminals 53a on a base film 51 of the TAB·LSI assembly 50 are directly connected to the liquid crystal driver electrodes 112 on each of the flexible plastic substrates of the liquid crystal panel 11.

The liquid crystal driver electrodes 112 (the segment electrodes 112a and the common electrodes 112b) are connected to the output terminals 53a of the TAB·LSI assembly 50 by either coating an anisotropic conductive resin (hot-melt resin) 113 on the electrodes 112a, 112b and heat-sealing it with a heating head or the like to connect the liquid crystal driver electrodes 112 and the output terminals 53a, as shown in FIGS. 9(b) and 9(c), or interposing an anisotropic conductive film between the liquid crystal driver electrodes 112 and the output terminals 53a and connecting them by way of thermal compression.

Other components of the above specific arrangement according to the second embodiment are not limited to any specific structures.

In the liquid crystal module of the above construction, since the base films of the flexible plastic substrates and the TAB·LSI assemblies comprise resin film sheets and have close coefficients of thermal expansion, any residual stresses after they are bonded to each other are small enough not to cause defects such as wire breaks or panel peeling.

Another specific arrangement according to the second embodiment will be described below.

Figure 11:
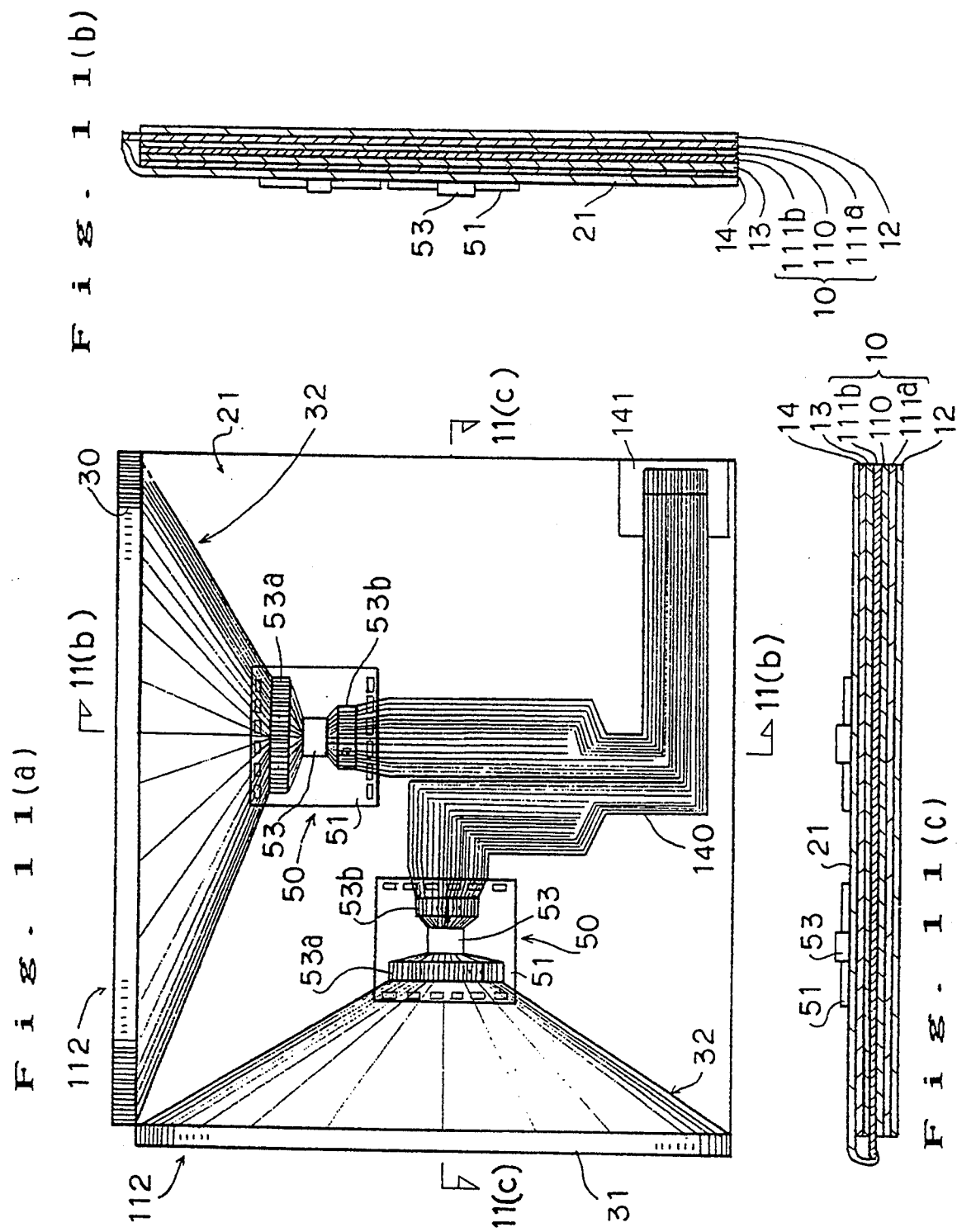
FIG. 11(a) is a plan view of another specific arrangement of the liquid crystal module according to the second embodiment of the present invention.
FIGS. 11(b) and 11(c) are cross-sectional views of the other specific arrangement shown in FIG. 11(a)

FIG. 11 (a) shows in plan a liquid crystal module according to the other specific arrangement, and FIGS. 11(b) and 11(c) are cross-sectional views taken along lines 11b—11b and 11c—11c, respectively, of FIG. 11 (a).

In FIGS. 11 (a), 11 (b), and 11 (c), the liquid crystal module comprises at least a liquid crystal panel 11, TAB·LSI assemblies 50, and a flexible circuit sheet 21.

The liquid crystal panel 11 and the TAB·LSI assemblies 50 are identical to those in the above specific arrangement.

According to the other specific arrangement, the liquid crystal driver electrodes 112 (the segment electrodes 112a and the common electrodes 112b) on the flexible plastic substrates of the liquid crystal panel 11 are connected to the output terminals 53a on the base film 51 of the TAB·LSI assembly 50 through the flexible circuit sheet 21.

The flexible circuit sheet 21 comprises a thin film (sheet) with printed wires 32 thereon, and is mounted on the reverse side of the liquid crystal panel lightly by a double-sided adhesive tape, a cellophane tape, an adhesive, or the like.

The materials of the flexible circuit sheet 21 and the printed wires 32 are the same as those of the first embodiment described above.

The printed wires may be produced by screen printing, photolithography, or the like. Hot-melt resin layers are coated as adhesive layers on the printed wires, so that the printed wires can be connected to the output terminals 53a of the TAB·LSI assemblies 50 by thermal compression. Components with such connecting capability are called heat-sealing connectors.

The configuration of the film of the flexible circuit sheet 21 and the design of the printed wires are selected so as to be suitable for connection between the liquid crystal driver electrodes 112 and the output terminals 53a on the base film 51 of the TAB·LSI assemblies 50 (provided independently for driving the common and segment electrodes).

Printed wires 32 and the liquid crystal driver electrodes 112, and printed wires 32 and the output terminals 53a of the TAB·LSI assemblies 50 on the flexible circuit sheet 21 are connected to each other by superimposing the printed wires 32 and the electrodes 112 and the output terminals 53a, and then joining them by way of thermal compression.

Other components of the above specific arrangement are not limited to any specific structures.

For example, a control circuit for controlling the liquid crystal driver LSI circuits is connected to the input terminals of the TAB·LSI assemblies.

The control circuit is a circuit for supplying the TAB·LSI assemblies with signals for controlling the voltage and pulse duration of a drive signal to be applied from the TAB·LSI assemblies to the liquid crystal panel, and comprises a computer (CPU) or the like.

The input terminals (control terminals) 53b of the TAB·LSI assemblies 50 are connected to the control circuit as follows: As shown in FIG. 11, ends of printed wires 140 on the flexible circuit sheet 21 are connected to the input terminals 53b of the TAB·LSI assemblies 50, and the other ends of the printed wires 140 are gathered and connected to a sheet-like connector 141, to which the control circuit is connected. The flexible circuit sheet may be a board generally referred to as a flexible printed circuit board (FPC).

Figure 12:
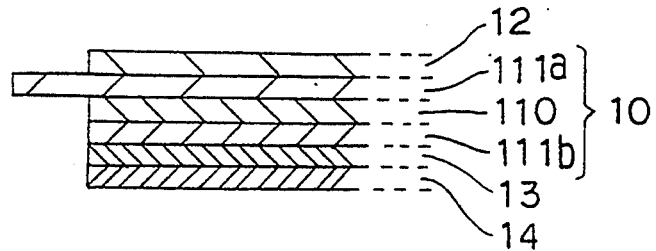
FIG. 12 is a fragmentary cross-sectional view of a liquid crystal panel with polarizers and a reflector in the other specific arrangement of the liquid crystal module.

As shown in FIGS. 11(b), 11(c), and 12, the liquid crystal panel 11 is usually combined with polarizing filters 12, 13, a reflector 14, or a backlight.

As in the first embodiment, the polarizing filters 12, 13 are generally made of a polyvinyl alcohol (PVA)—iodine material, or a PVA—dye material. The polarizing filters 12, 13 should preferably be flexible, and hence should preferably of a thickness of 0.2 mm or less.

For display in an operation mode based on interference between birefringent lights, the polarizing filters 12, 13 are disposed on the face and reverse sides, respectively, of the liquid crystal panel 11 in crossed nicols. For display in an operation mode based on a guest-host configuration, the polarizing filters are disposed only on the face side (display side) of the liquid crystal, or the reverse side thereof. In any case, the polarizing filters 12, 13 are bonded to the flexible plastic substrates such that the contrast ratio is maximum.

The reflector 14 is identical to that according to the first embodiment described above.

If a backlight is employed in place of the reflector, then the liquid crystal panel is of the transmission type.

According to the second embodiment, the liquid crystal panel may be constructed such that the entire structure in which the polarizing filters and the reflector are disposed on the flexible plastic substrates and the liquid crystal driver circuit composed of the TAB·LSI assemblies and the flexible circuit sheet is attached to the reverse side of the liquid crystal panel, has a thickness of 3 mm or less.

Figure 13:
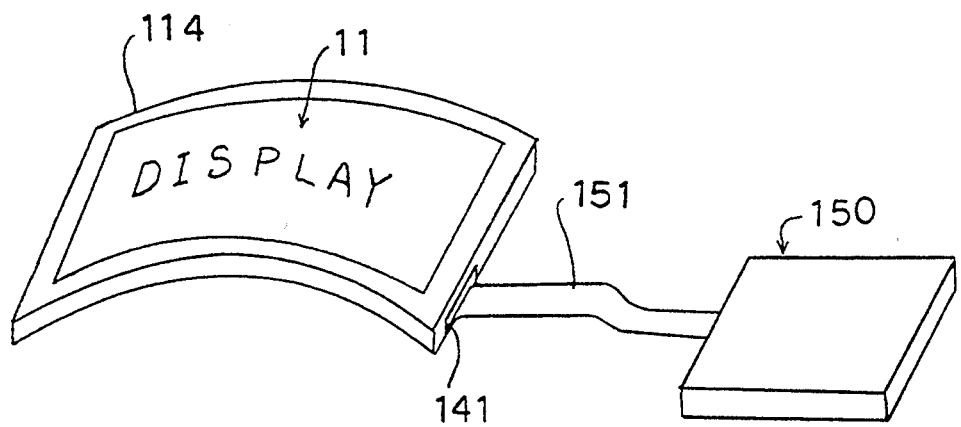
FIG. 13 is a perspective view showing a liquid crystal panel bezel and a control circuit of the other specific arrangement of the liquid crystal module.

As shown in FIG. 13, the liquid crystal panel is housed in a frame 114, making up a liquid crystal module which is connected to an external control circuit 150 by a cable 151. The cable 151 has a connector 141 that may be fixed to the frame 114 by an adhesive, an adhesive tape, or a screw which may be selected depending on the application in which the liquid crystal module is used.

The control circuit 150 applies signals for controlling the voltage and pulse duration of a drive signal for driving the liquid crystal panel, to the TAB·LSI assemblies 50, which then drive the liquid crystal panel 11.

Figure 14A:
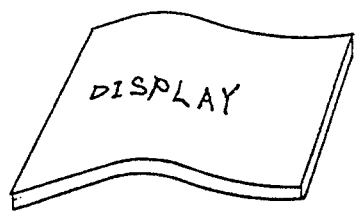
FIGS. 14(a) and 14(b) are perspective views showing bent and flat conditions of the liquid crystal panel according to the second embodiment of the present invention.
Figure 14B:
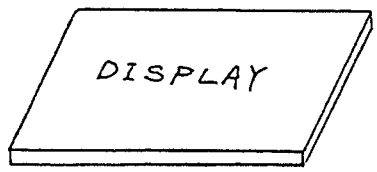

With the polarizing filters and the reflector being disposed on the liquid crystal panel (flexible plastic substrates) and also with the liquid crystal driver circuit composed of the TAB·LSI assemblies and the flexible circuit sheet being attached (the entire thickness should preferably be 3 mm or less), the liquid crystal panel can be bent in its entirety to small and large curvatures. For example, the liquid crystal panel may be bent into a wavy shape as shown in FIG. 14(a), or may be held flatwise to display images flatwise as shown in FIG. 14(b).

When the liquid crystal panel is bent, it does not suffer defects such as wire breaks or peeling of the panel.

The liquid crystal module shown in FIG. 11 has two TAB·LSI assemblies. However, the number of connected TAB·LSI assemblies is determined depending on the numbers of common and segment electrodes. For example, a liquid crystal panel having a display capability of 5 rows and 10 columns with one character represented by 32×32 dots requires 160 common electrodes and 350 segment electrodes. In the case where an LSI circuit having 160 output terminals per chip is used on each of the TAB·LSI assemblies 50 for driving a liquid crystal panel, one TAB·LSI assembly 50 is connected to common-side electrode terminals and two TAB·LSI assemblies 50 are connected to segment-side electrode terminals, as shown in FIGS. 15(a)~15(c), thus driving the liquid crystal panel with 160×320 dots.

Figure 15B:
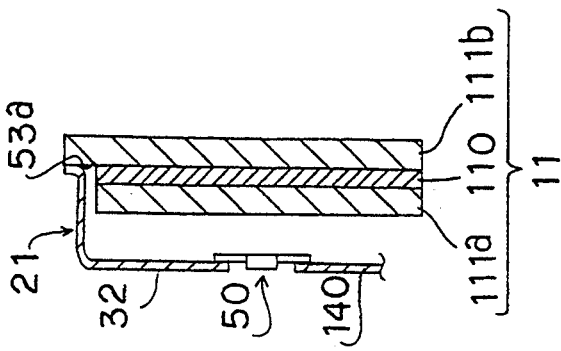
FIGS. 15(b) and 15(c) are cross-sectional views of the still other specific arrangement shown in FIG. 15(a)
Figure 15A:
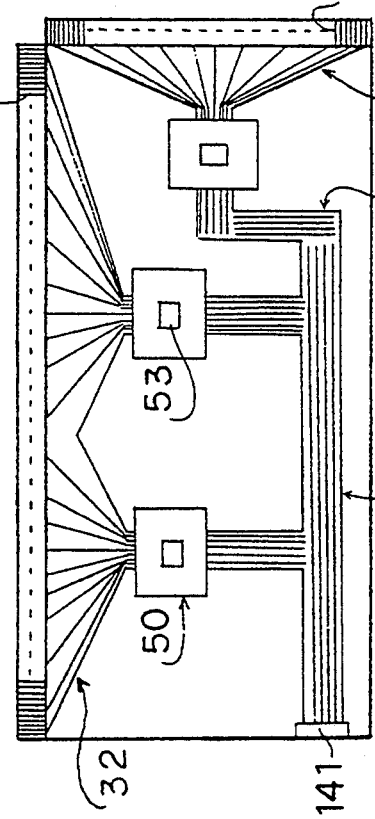
FIG. 15(a) is a plan view of still another specific arrangement of the liquid crystal module according to the second embodiment of the present invention.
Figure 15C:
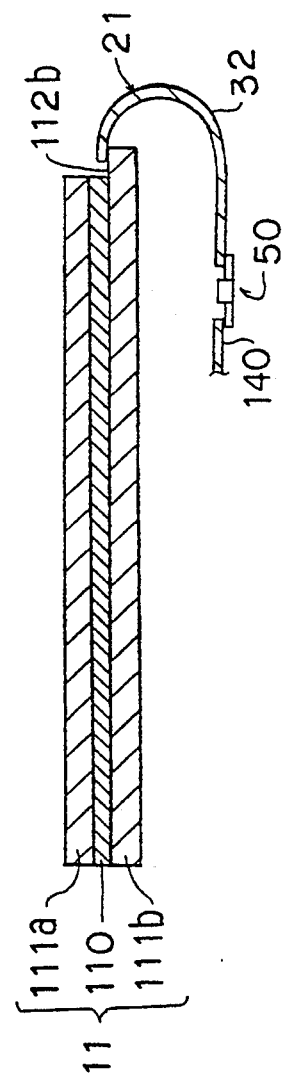
Figure 16:
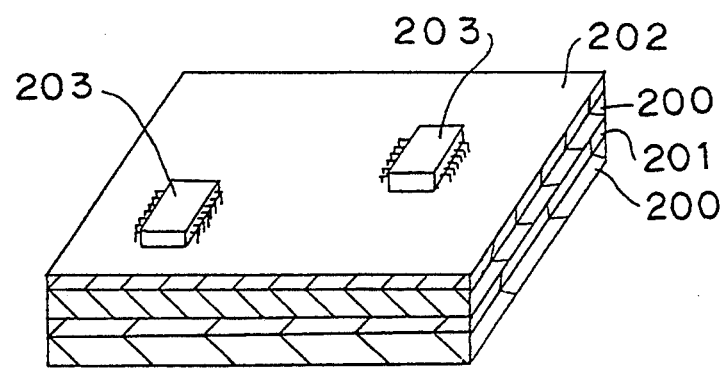
FIG. 16 is a perspective view of a conventional liquid crystal display device.

As shown in FIGS. 15(b) and 15(c), the flexible circuit sheet 21 may not be bonded to the reverse side of the liquid crystal panel 11.

EXAMPLES

The second embodiment of the present invention will be described in greater detail with reference to Examples.

Inventive Example 1 (the one specific arrangement)

In the liquid crystal module shown in FIGS. 9(a), 9(b), and 9(c), a film of polyether sulfone (PES) having a thickness of 100 μm was used as each of the flexible plastic boards, and a film of pyromellitic dianhydride polyimide having a thickness of 100 μm (manufactured by Du Pont Ltd.; Kapton) as the base film of the TAB·LSI assemblies. The liquid crystal driver electrodes on the flexible plastic substrates and the output terminals on the base film of the TAB·LSI assemblies were bonded by an anisotropic conductive resin (manufactured by Three Bond Co.; Three Bond 3370).

The coefficients of thermal expansion of the PES film and the base film of the TAB·LSI assemblies were measured. The coefficient of thermal expansion ($\alpha_{PES}$) of the PES film was $5.5 \times 10^{-5}$ (cm/cm/°C.), and the coefficient of thermal expansion ($\alpha_{TAB}$) of the base film of the TAB·LSI assemblies was $2.6 \times 10^{-5}$ (cm/cm/°C.).

The residual stress of the joint, which was calculated from the strains that the PES film and the base film of the TAB·LSI assemblies suffered, was $5.1 \times 10^{-3}$ (Kg/cm$^2$). These results are shown in Table 1 below.

Inventive Example 2 (the other specific arrangement)

In the liquid crystal module shown in FIGS. 11(a), 11(b), and 11(c), a film of polyethylene terephthalate (PET) having a thickness of 50 μm was used as the flexible circuit sheet, and the same materials as those described in Example 1 were used as the flexible plastic substrates, the base film of the TAB·LSI assemblies, and the anisotropic conductive resin.

The measured coefficient of thermal expansion ($\alpha_{PET}$) of the PET sheet was $7.5 \times 10^{-5}$ (cm/cm/°C.). The residual stress of the joint between the liquid crystal driver electrodes on the flexible plastic substrates and the connection lines on the flexible circuit sheet was $3.0 \times 10^{-3}$ (Kg/cm$^2$). These results are shown in Table 1 below.

Comparative Example 1

A liquid crystal module was fabricated in the same manner as Inventive Example 1 except that glass substrates were used instead of the flexible plastic substrates.

The measured coefficient of thermal expansion ($\alpha_{glass}$) of the glass substrates was $3.2 \times 10^{-6}$ (cm/cm/°C.). The measured residual stress of the joint was $8.3 \times 10^{-3}$ (Kg/cm$^2$). These results are shown in Table 1 below.

Comparative Example 2

A liquid crystal module was fabricated in the same manner as Inventive Example 2 except that glass substrates were used instead of the flexible plastic substrates.

The measured coefficient of thermal expansion ($\alpha_{glass}$) of the glass substrates was $3.2 \times 10^{-6}$ (cm/cm/°C.). The measured residual stress of the joint was $3.2 \times 10^{-2}$ (Kg/cm$^2$). These results are shown in Table 1 below.

TABLE 1

| | Substrate material | Joined material | Residual stress (Kg/cm$^2$) |
|---|---|---|---|
| Inventive Example 1 | PES | Polyimide | $5.1 \times 10^{-3}$ |
| Inventive Example 2 | " | PET | $3.0 \times 10^{-3}$ |
| Comparative Example 1 | Glass | Polyimide | $8.3 \times 10^{-3}$ |
| Comparative Example 2 | " | PET | $3.2 \times 10^{-2}$ |

As is apparent from Table 1, the residual stress in the joint of the liquid crystal module according to the present invention is reduced.

Inventive Example 3

In the liquid crystal module shown in FIGS. 9(a), 9(b), and 9(c), a film of polyether sulfone (PES) having a thickness of 100 μm was used as each of the flexible plastic substrates, and stripe-like ITO electrodes having a thickness of 1000 Å were formed on the PES films. The surfaces of the PES films with the electrodes formed thereon are disposed in facing relationship to each other such that the electrodes were arranged in a matrix, and a ferroelectric liquid crystal was sealed between the pair of these upper and lower PES films. The liquid crystal layer had a thickness of about 2 $\mu$m. The sandwiched ferroelectric liquid crystal was oriented by a known orienting process (such as disclosed in Japanese laid-open patent publication No. 2-73219).

Then, polarizing filters (manufactured by Sanritz K.K.) each having a thickness of 180 $\mu$m were bonded to upper and lower surfaces of the liquid crystal panel in a manner to provide a maximum contrast. Furthermore, a reflector (manufactured by Panac K.K.; Alpet) having a thickness of about 130 $\mu$m was bonded to the lower surface of the assembly.

A flexible circuit sheet was fabricated by forming printed wires on a polyester film having a thickness of 25 $\mu$m according to a screen printing process, and depositing a hot-melt resin layer on the printed wires. The overall thickness of the flexible circuit sheet was 40 $\mu$m.

TAB (HD66107T12) manufactured by Hitachi, Ltd. was used as the liquid crystal driver LSI circuits. The base film was made of Kapton and had an overall thickness of 1 mm.

One side of the flexible circuit sheet was connected to the liquid crystal driver electrodes (common electrodes and segment electrodes) by thermal compression, and the other side of the flexible circuit sheet was connected to the output terminals of the TAB·LSI assemblies by thermal compression. To the input terminals of the TAB·LSI assemblies, there was connected one end of another flexible sheet identical to the above flexible circuit sheet, the other flexible sheet being connected to a control circuit through a connector on the other end of the other flexible circuit sheet, thus making up a liquid crystal module.

The liquid crystal panel had an overall thickness of about 1.7 mm, and could freely be bent with the TAB·LSI assemblies (driver circuits) mounted on the reverse side thereof. It was possible to display an image on the bent panel when image data, control data, and power were supplied from the control circuit to the liquid crystal panel.

Inventive Example 4

A liquid crystal module was fabricated in the same manner as Inventive Example 3 except that a guest-host ferroelectric liquid crystal composition with a dye mixed therein was used as the ferroelectric liquid crystal composition, and that a polarizer was attached to only the display surface for a maximum contrast. The overall thickness of the panel was about 1.5 mm.

The panel could freely be bent, and could display an image while being bent.

Industrial applicability

The liquid crystal module according to the present invention can be used as an information display device such as for office automation systems, home-use electric appliances, and various instruments. Particularly, the liquid crystal module is suitable for use as an information display device which is required to be flexible, lightweight, and thin or low in profile.

We claim:

1. A liquid crystal module comprising:
    a matrix liquid crystal unit including a liquid crystal panel composed of two flexible plastic substrates and a liquid crystal material sandwiched between the flexible plastic substrates, said liquid crystal panel having liquid crystal drive electrodes and first terminals for the liquid crystal drive electrodes at a side portion thereof, and a flexible circuit sheet having a plurality of liquid crystal drive TAB·LSI assemblies mounted thereon and second and third terminals for the liquid crystal drive TAB·LSI assemblies at side portions thereof, said liquid crystal panel and said flexible circuit sheet being piled and lightly connected together, and the first and second terminals being electrically connected to each other at the side portions; and
    a thin board having a circuit thereon and a lock connector at a side portion, said thin board being disposed over the flexible circuit sheet and lightly connected thereto, said lock connector being fixed to the third terminals for electrically connecting said circuit of the thin board to the liquid crystal drive TAB·LSI of the flexible circuit sheet so that the liquid crystal module is made flexible.

2. A liquid crystal module according to claim 1, wherein said thin board doubles as a reinforcing plate for said matrix liquid crystal unit.

3. A liquid crystal module according to claim 1, wherein said liquid crystal material consists of a composition that comprises a ferroelectric liquid crystalline polymer.

4. A liquid crystal module according to claim 1, wherein said flexible circuit sheet with the liquid crystal driver TAB·LSI assemblies mounted thereon is disposed on a back side of said liquid crystal panel.

5. A liquid crystal module according to claim 1, further comprising resilient adhesive materials situated between said liquid crystal panel and said flexible circuit sheet, and between said flexible circuit sheet and said thin board to connect these members together.

6. A liquid crystal module comprising at least a liquid crystal panel having two flexible plastic substrates and a liquid crystal material sandwiched between the flexible plastic substrates, at least one of said flexible plastic substrates having a group of liquid crystal driver electrodes thereon and first terminals for the liquid crystal driver electrodes at a side portion thereof,
    a plurality of liquid crystal driver TAB·LSI assemblies, each having output terminals, and
    a flexible circuit sheet piled over the liquid crystal panel and lightly connected thereto, said flexible circuit sheet having printed wires formed thereon to which said liquid crystal driver TAB·LSI assemblies are fixed, and second terminals located at ends of the printed wires at a side portion of the flexible circuit sheet, said first and second terminals being directly connected together at the side portions to connect said liquid crystal driver TAB·LSI assemblies to said liquid crystal driver electrodes through said connection lines on said flexible circuit sheet so that the liquid crystal module is made flexible.

7. A liquid crystal module according to claim 6, further including a polarizing filter disposed on at least one of said two flexible plastic substrates, and a reflector disposed on a non-display side of said liquid crystal panel, wherein each of said flexible plastic substrates have a thickness of 0.3 mm or less, said polarizing filter has a thickness of 0.2 mm or less, said reflector has a thickness of 0.2 mm or less, and said flexible circuit sheet has a thickness of 0.1 mm or less.

8. A liquid crystal module according to claim 6, wherein each of said liquid crystal drive TAB·LSI assemblies has a group of input terminals to be connected to a control circuit for controlling the liquid crystal driver TAB·LSI assemblies.

9. A liquid crystal module according to claim 6, wherein said liquid crystal driver TAB·LSI assemblies are disposed on a back side of said liquid crystal panel.

10. A liquid crystal module according to claim 6, further comprising a resilient adhesive material situated between said liquid crystal panel and said flexible circuit sheet to connect these members together.

* * * * *